(12) United States Patent
Yap (10) Patent No.: US 9,024,429 B2
(45) Date of Patent: May 5, 2015

(54) MICROELECTRONIC PACKAGES CONTAINING OPPOSING DEVICES AND METHODS FOR THE FABRICATION THEREOF

(71) Applicant: Weng F. Yap, Phoenix, AZ (US)

(72) Inventor: Weng F. Yap, Phoenix, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 14/013,923

(22) Filed: Aug. 29, 2013

(65) Prior Publication Data

US 2015/0061139 A1  Mar. 5, 2015

(51) Int. Cl.
*H01L 23/043* (2006.01)
*H01L 23/00* (2006.01)
*H01L 21/768* (2006.01)

(52) U.S. Cl.
CPC .............. *H01L 24/26* (2013.01); *H01L 21/768* (2013.01); *H01L 24/83* (2013.01)

(58) Field of Classification Search
CPC .. H01L 23/13; H01L 23/498; H01L 23/49827
USPC .................. 257/687, 700, 702, 723
See application file for complete search history.

(56) References Cited

U.S. PATENT DOCUMENTS 5,241,456 A * 8/1993 Marcinkiewicz et al. .... 361/792
8,187,920 B2 * 5/2012 Mohan et al. ................. 438/106
2012/0021565 A1 1/2012 Gong et al.
2013/0049182 A1 2/2013 Gong et al.
2013/0049218 A1 2/2013 Gong et al.

FOREIGN PATENT DOCUMENTS

DE    EP 2477466  * 7/2012 ............... H05K 1/18

OTHER PUBLICATIONS

PowerPoint Presentation titled, "Freescale's Redistributed Chip Packaging (RCP)". Disclosed in 2012 Symposium.

* cited by examiner

*Primary Examiner* — Roy Potter
*Assistant Examiner* — Paul Patton
(74) *Attorney, Agent, or Firm* — Ingrassia Fisher & Lorenz, P.C.

(57) ABSTRACT

Microelectronic packages and methods for fabricating microelectronic packages are provided. The fabrication method may be carried-out utilizing a preformed panel having a frontside cavity and a backside cavity in which first and second microelectronic devices are positioned, respectively. One or more frontside RDL layers are produced over the frontside of the preformed panel in ohmic contact with or otherwise electrically coupled to the first microelectronic device. Similarly, one or more backside RDL layers are formed over the backside of the preformed panel in ohmic contact with or otherwise electrically coupled to the second microelectronic device. A frontside contact array is produced over the frontside of the preformed panel and electrically coupled to at least the first microelectronic device through the frontside RDL layers. Lastly, the preformed panel is singulated to yield a microelectronic package including a package body in which the first and second microelectronic devices are embedded.

20 Claims, 9 Drawing Sheets

MICROELECTRONIC PACKAGES CONTAINING OPPOSING DEVICES AND METHODS FOR THE FABRICATION THEREOF

TECHNICAL FIELD

Embodiments of the present invention relate generally to microelectronic packaging and, more particularly, to microelectronic packages and methods for fabricating microelectronic packages containing microelectronic devices positioned in an opposing (opposite facing) relationship, such as a back-to-back relationship.

BACKGROUND

Fan-Out Wafer Level Packaging (FO-WLP) processes are well-known within the semiconductor industry for producing microelectronic packages having peripheral fan-out areas, which enlarge the surface area of the package topside over which the contact array is formed. One known FO-WLP approach may be referred to as "Redistributed Chip Packaging" or "RCP" packaging approach. In an example of an RCP packaging approach, a pick-and-place tool is used to position an array of semiconductor die within the central opening of a taped mold frame. An encapsulant is then dispensed into the mold frame and over the array of semiconductor die. The encapsulant is thermally cured to produce a molded panel in which the array of semiconductor die is embedded, and the taped mold frame is removed to reveal the frontside of the molded panel through which the semiconductor die are exposed. After backside grinding and additional curing of the panel, a carrier is attached to the panel backside to allow a number of build-up layers or Redistribution Layers (RDL layers), as well as a Ball Grid Array (BGA) or other contact array, to be formed over the panel frontside and the die exposed therethrough. The RDL layers include successively-deposited dielectric layers in which a number of metal traces and plugs are formed to provide electrically-conductive paths between the bond pads of the embedded die and the overlying BGA. Finally, the molded panel is singulated to yield a number of RCP packages each containing a different encapsulated semiconductor die.

BRIEF DESCRIPTION OF THE DRAWINGS

At least one example of the present invention will hereinafter be described in conjunction with the following figures, wherein like numerals denote like elements, and.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "comprise," "include," "have," and the like are intended to cover non-exclusive inclusions, such that a process, method, article, or apparatus referred to as comprising, including, or having a list of elements is not necessarily limited to those elements, but may include other elements not expressly listed. The term "coupled," as appearing herein, is defined as directly or indirectly connected in an electrical or non-electrical manner. Furthermore, terms such as "over," "under," "on," and the like are utilized to indicate relative position between two structural elements or layers and not necessarily to denote physical contact between structural elements or layers. Thus, a first structure or layer may be described as fabricated "over" or "on" a second structure, layer, or substrate without indicating that the first structure or layer necessarily contacts the second structure, layer, or substrate due to, for example, presence of one or more intervening layers.

In the context of this document, the term "microelectronic device" is used in a broad sense to refer to an electronic device, component, or structure produced on a relatively small scale and amenable to packaging in the below-described manner. Microelectronic devices include, but are not limited to, integrated circuits formed on semiconductor die, Microelectromechanical Systems (MEMS) devices, passive electronic components (e.g., discrete resistors, capacitors, and inductors), optical devices, and other small scale electronic devices capable of providing processing, memory, sensing, radiofrequency, optical, and actuator functionalities, to list but a few examples. Microelectronic devices also include other discrete or separately-fabricated structures that can be integrated into the microelectronic package, such as prefabricated antenna structures. The terms "opposed" and "opposing" are utilized to describe the relative positioning of two packed microelectronic devices facing in substantially opposite directions, such as first and second semiconductor die facing toward the respective frontside and backside surfaces of the package in which they are contained. Such opposing devices preferably, but need not always align or overlap as taken through the thickness of the package; that is, as taken along an axis orthogonal to the package frontside or backside. Finally, the phrase "back-to-back" is utilized to refer to the positioning of two opposed microelectronic devices having at least a portion of their respective backsides (e.g., the non-contact bearing sides of the two semiconductor die) positioned within relatively close proximity, as taken along an axis orthogonal to the package frontside or backside.

The following describes embodiments of a fabrication process suitable for producing microelectronic packages each containing at least two microelectronic devices positioned within an opposite (opposite facing) relationship, such as two semiconductor die positioned in a back-to-back relationship. The below-described fabrication process is advantageously carried-out utilizing a preformed panel having frontside and backside cavities in which the opposing devices are inserted or installed. In contrast to RCP packaging processes wherein a panel is molded directly over the packaged devices, the preformed panel is produced prior to insertion of the microelectronic devices and can be produced by other fabrication techniques in addition to molding. During the fabrication process, RDL layers are formed over both the frontside and backside of the preformed panel and the microelectronic devices inserted therein. The frontside and backside RDL layers may electrically interconnect the embedded devices to each other, to a frontside contact array (e.g., a first BGA) later formed over the package frontside, to a backside contact array (e.g., a second BGA) later formed over the package backside, and/or to any other electrically-conductive structure or device contained within or mounted to the package. During or prior to fabrication of the RDL layers, one or more through package vias may be formed through the preformed panel to increase interconnectivity and/or to improve the heat dissipation abilities of the completed package. In further embodiments, the preformed panel may be fabricated to include substrate routing when initially produced.

FIGS. 1-13 illustrate a multi-device FO-WLP microelectronic package 20, as shown at various stages of completion and produced in accordance with a first exemplary embodiment of the present invention. Microelectronic package 20 is produced utilizing a preformed or prefabricated panel, which is processed and singulated in the below-described manner to yield a number of microelectronic packages including package 20. In this regard, FIGS. 1, 2, and 4-14 illustrated, in cross-section, a portion of an exemplary preformed panel 22 that may be utilized in the production of microelectronic package 20. It will be appreciated that preformed panel 22 will typically be considerably larger than the illustrated portion shown in FIGS. 1, 2, and 4-13; and that partially-completed microelectronic package 20 will remain integrally joined to the other partially-completed microelectronic packages produced in parallel with package 20 until singulation of panel 22 and completion of the below-described fabrication process. The other microelectronic packages produced pursuant to the below-described fabrication process may or may not be substantially identical to microelectronic package 20; however, the process steps described herein will typically be performed globally across preformed panel 22 and are consequently generally descriptive of the processing of panel 22, as a whole.

Figure 1:
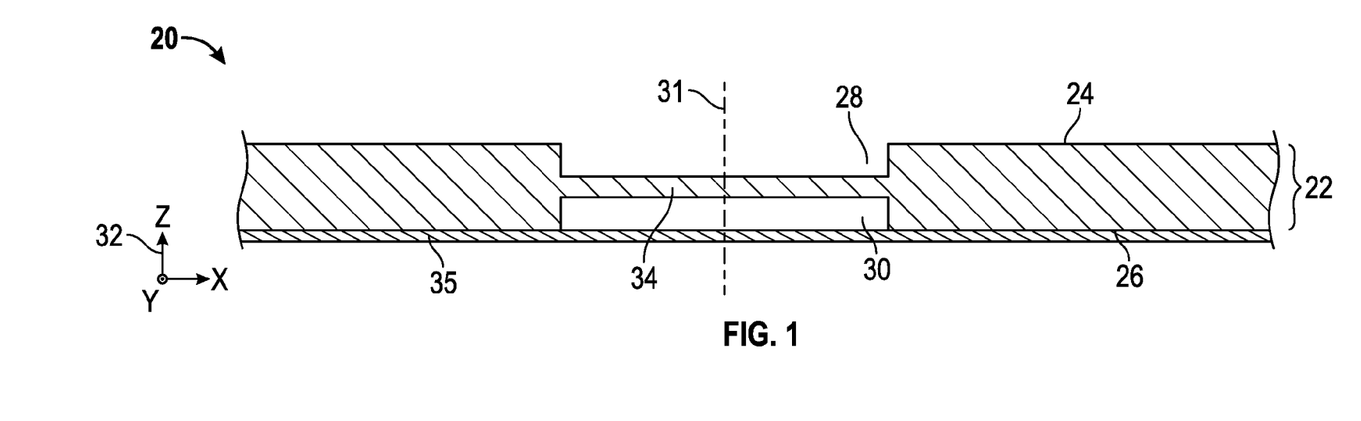
FIGS. 1-13 illustrate a microelectronic package containing two microelectronic devices positioned in an opposite-facing relationship (e.g., a back-to-back relationship) within partitioned cavities provided in a preformed panel (partially shown), as illustrated at various stages of manufacture and produced in accordance with a first exemplary embodiment of the microelectronic package fabrication method.

Referring initially to FIG. 1, preformed panel 22 includes an upper principal surface or "frontside" 24 and an opposing lower principal surface or "backside" 26. A number of frontside cavities 28 and backside cavities 30 have been formed in frontside 24 and in backside 26 of preformed panel 22, respectively. One frontside cavity 28 and one backside cavity 30 are included in the portion of panel 22 shown in FIG. 1 and, therefore, included within partially-completed microelectronic package 20. More specifically, as indicated in FIG. 1 by package centerline 31, frontside cavity 28 and backside cavity 30 may be formed within a central region of the portion of panel 22 included within microelectronic package 20, when completed. Each frontside cavity 28 may vertically align with or overlap with its corresponding backside cavity 30, as taken through the package thickness; that is, as taken along an axis substantially orthogonal to frontside 24 or backside 26 of panel 22 (identified as the Z-axis by coordinate legend 32 in FIG. 1). When aligned in this manner, each frontside cavity 28 may connect with or adjoin to its aligning backside cavity 30 to collectively form a continuous tunnel extending fully through the body of panel 22. Alternatively, as indicated in FIG. 1, each frontside cavity 28 may be separated from its aligning backside cavity 30 by a partition wall 34, which may be integrally formed with the body of preformed panel 22. In further embodiments, frontside and backside cavities 28 and 30 may not be formed within a central region of the package body and may not overlap or may only partially overlap, as taken through the package thickness.

Frontside and backside cavities 28 and 30 can be fabricated to have any desired planform shape and dimensions. The shape and dimensions of cavities 28 and 30 may be substantially identical as shown in FIG. 1 or may instead vary. Generally, the planform shape and dimensions of cavities 28 and 30 will be determined, at least in part, by the form factor and size of the microelectronic devices received thereby and the dimensions of any clearance between the packaged devices and the cavity sidewalls. In the illustrated example wherein semiconductor die are later positioned in cavities 28 and 30, frontside and backside cavities 28 and 30 may each have a substantially rectangular planform geometry and a length and width slightly greater than the die received thereby to provide such a clearance, as described more fully below in conjunction with FIG. 2. While shown as including only a single frontside cavity 28 and a single backside cavity 30 in FIG. 1, microelectronic package 20 (and the other microelectronic packages produced over the non-illustrated regions of preformed panel 22) can include multiple frontside and/or multiple backside cavities in further embodiments.

Preformed panel 22 can be produced utilizing various different fabrication techniques and materials. A non-exhaustive list of materials suitable for usage in the production of panel 22 include plastics, composite materials (e.g., a resin-impregnated woven glass fiber), ceramics, and other dielectric materials of the type commonly utilized in the fabrication of printed circuit boards. Preformed panel 22 is conveniently produced utilizing a lamination or molding process, such as pour molding, compression molding, or injection molding. In one embodiment, preformed panel 22 is produced utilizing a process similar to an RCP panelization process, but without molding the panel directly over the packaged devices. In this case, a silica-filled epoxy or other mold compound may first be dispensed into an empty mold frame defining the planform (e.g., circular) shape of the panel body. The mold compound may then be solidified by a partial or full thermal cure and removed from the mold frame to yield a panel blank. If desired, the panel blank may be ground to final thickness. Additional curing (e.g., a final oven bake) and/or cleanings steps may be performed. Frontside and backside cavities 28 and 30 may then be created in the molded panel blank by localized grinding or a similar material removal process to produce preformed panel 22 as shown, in part, in FIG. 1. In further embodiments, frontside and backside cavities 28 and 30 may be molded directly into the panel body utilizing, for example, an injection molding process.

Figure 2:
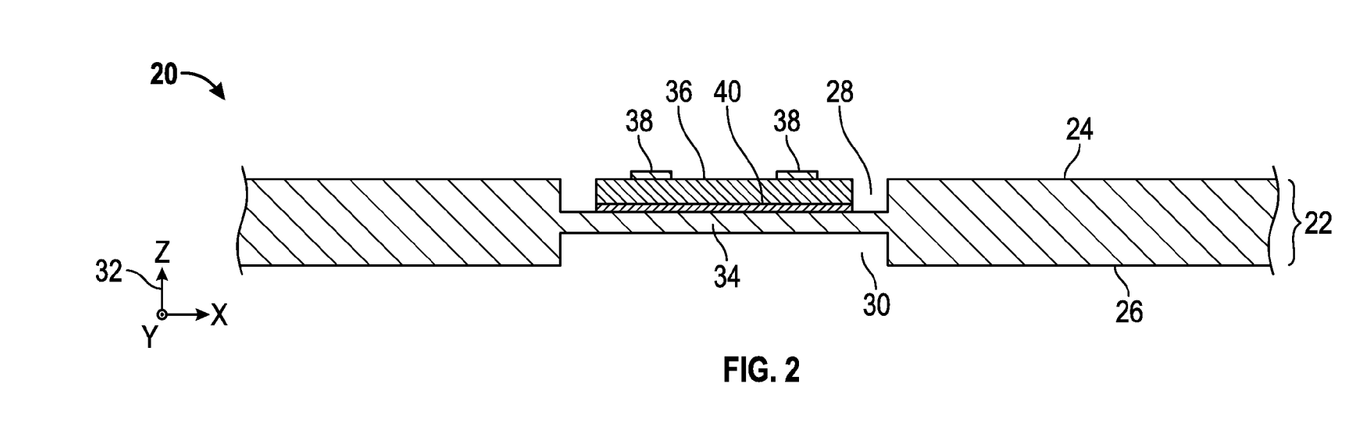
Figure 3:
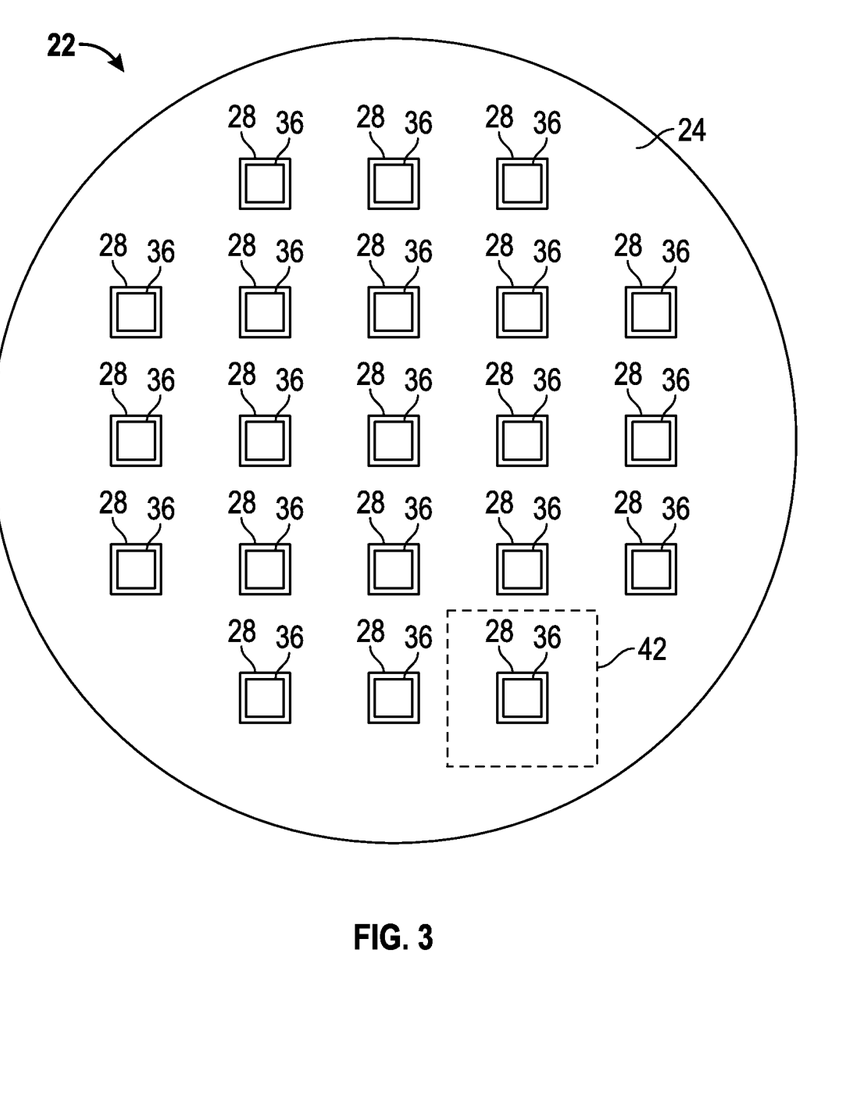

Continuing with the exemplary fabrication process, at least one microelectronic device is next positioned within each frontside cavity 28 provided in preformed panel 22. The microelectronic devices are each positioned face-up; that is, with their respective active or contact-bearing sides exposed through frontside 24 of panel 22 and facing away from backside 26 of panel 22. For example, as shown in FIG. 2, a first semiconductor die 36 may be disposed within frontside cavity 28 included within the illustrated portion of panel 22 over which microelectronic package 20 is fabricated. Die 36 is positioned such that its active side, which supports a number of bond pads 38, is exposed through frontside 24 of preformed panel 22. Conversely, the non-active or backside of each die 36 may be bonded to the upper surface of partition wall 34 utilizing a layer 40 of epoxy or other die attach material. Additional semiconductor die or other microelectronic devices may likewise be positioned within the frontside cavities 28 formed within the non-illustrated regions of preformed panel 22 over which the other microelectronic packages are fabricated. To facilitate processing, preformed panel 22 may be attached to a ceramic carrier or other temporary support structure 35 prior to insertion of die 36 and the other microelectronic devices within the frontside cavities 28.

Frontside cavities 28 may be fabricated to have a depth substantially equivalent or slightly greater than the height of semiconductor die 36. As a result, when each semiconductor die 36 is properly seated with its respective cavity 28, the active surface or topside of the die 36 may be substantially level or coplanar with frontside 24 of preformed panel 22, as generally shown in FIG. 2. Additionally, as noted above, each frontside cavity 28 may be produced to have planform dimensions slightly greater than those of the semiconductor die 36 received thereby such that a relatively small circumferential clearance or gap is provided around the perimeter of each die 36. This may be more fully appreciated by referring briefly to FIG. 3, which is a top-down view of preformed panel 22 after positioning of semiconductor die 36 within frontside cavities 28. As appearing in the lower right hand corner of FIG. 3, dashed box 42 generally demarcates the region of preformed panel 22 shown in cross-section in FIGS. 1, 2, and 4-13 and over which exemplary microelectronic package 20 is produced.

After positioning of die 36 within frontside cavities 28, a plurality of electrically-conductive paths or interconnect lines may now be formed over preformed panel 22 to interconnect semiconductor die 36 to a subsequently-produced frontside contact array, a subsequently-produced backside contact array, and/or to another microelectronic device included within package 20, such as a second semiconductor die later mounted within backside cavity 30. The interconnect lines may comprise electrically-conductive (e.g., copper) traces and plugs formed in one or more RDL layers, which are successively formed over frontside 24 and backside 26 of preformed panel 22 in the below-described manner. The interconnect lines may also include Through Package Vias ("TPVs"), which extend through the body of preformed panel 22 to provide signal routing between the RDL layers formed over the frontside and backside of panel 22. Such TPVs may be produced as the frontside RDL layers are successively built over frontside 24 and/or as the backside RDL layers are formed over backside 26 of panel 22. Additionally, one or more TPVs may be produced prior to the production of the frontside or backside RDL layers, as described below in conjunction with FIG. 4. Finally, electrically-conductive paths may be also provided through preformed panel 22 in the form of substrate routing embedded within or formed on panel 22 during fabrication thereof, as described more fully below in conjunction with FIG. 16.

Figure 4:
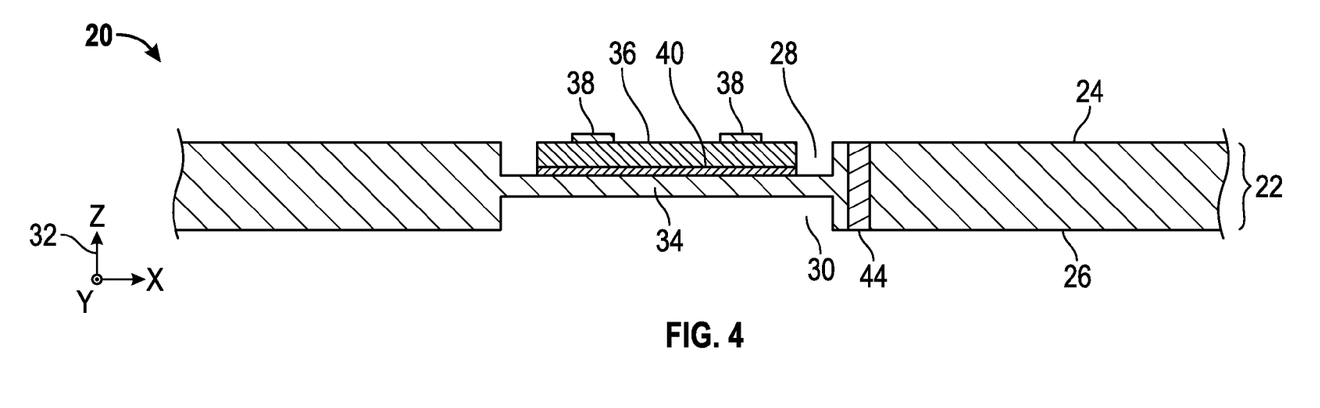

FIG. 4 is a cross-sectional view of partially-fabricated microelectronic package 20, as illustrated after the formation of a number of TPVs 44 extending through the body of preformed panel 22. While only one TPV 44 is shown in FIG. 4, it will be appreciated that additional TPVs 44 may likewise be formed in the other, non-illustrated regions of panel 22 over which the other microelectronic packages are fabricated. The opposing ends of each TPV 44 terminate at a level coplanar with frontside 24 and backside 26 of panel 22, respectively. For this reason, TPVs 44 may be referred to herein as an "$V_0$-to-$V_0$ TPVs 44." $V_0$-to-$V_0$ TPVs 44 are conveniently produced by first forming vertical tunnels or openings through the body of preformed panel 22 utilizing, for example, a laser drilling process. The tunnels are then filled with an electrically-conductive material, such an electrically-conductive paste, to produce $V_0$-to-$V_0$ TPVs 44. In this regard, a silver-filled epoxy, a copper-filled epoxy, or another electrically-conductive epoxy may be dispensed into the tunnels drilled through panel 22 to produce TPVs 44. In further embodiments, TPVs 44 may be produced prior to the attachment of die 36.

Figure 5:
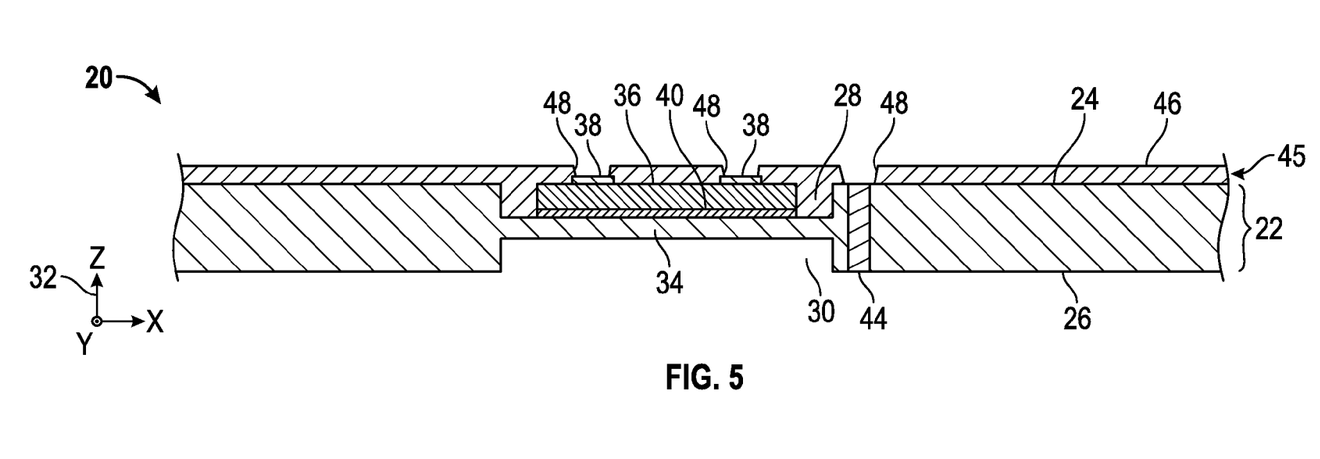

One or more frontside RDL layers 45 may now be produced over frontside 24 of preformed panel 22. With reference to FIG. 5, production of frontside RDL layers 45 may commence with the deposition (e.g., spin-on application) of a first ($V_1$) dielectric layer 46 over frontside 24 of preformed panel 22 and over semiconductor die 36 disposed within frontside cavities 28. In the illustrated example wherein a circumferential clearance is provided between each die 36 and surrounding sidewalls of the frontside cavity 28 in which the die 36 is mounted, the dielectric material utilized to form the $V_1$ dielectric layer 46 flows into each frontside cavity 28 and fills the clearance provided therein. As a result, RDL dielectric layer 46 not only overlies frontside 24 of panel 22, but also surrounds or envelopes the semiconductor die 36 previously inserted into frontside cavities 28. Stated differently, the dielectric material deposited during formation of frontside RDL layers 45 partially fills frontside cavities 28 by flowing into the space not occupied by die 36. Dielectric layer 46 is preferably composed of a photoimagable material, such as polyimide or a BCB-based material. Such a material should be distinguished form non-photoimagable materials, such as non-photoimagable epoxies and resins utilized solely for die encapsulation purposes. After deposition, $V_1$ dielectric layer 46 is lithographically patterned to form a number of openings 48 therein exposing bond pads 38 of semiconductor die 36 and $V_0$-to-$V_0$ TPVs 44. The structure shown in FIG. 5 results.

Figure 6:
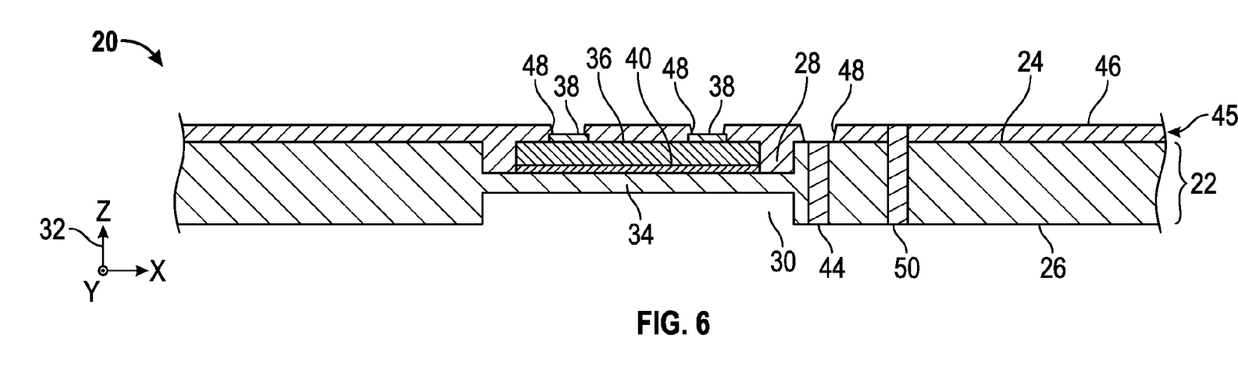
Figure 7:
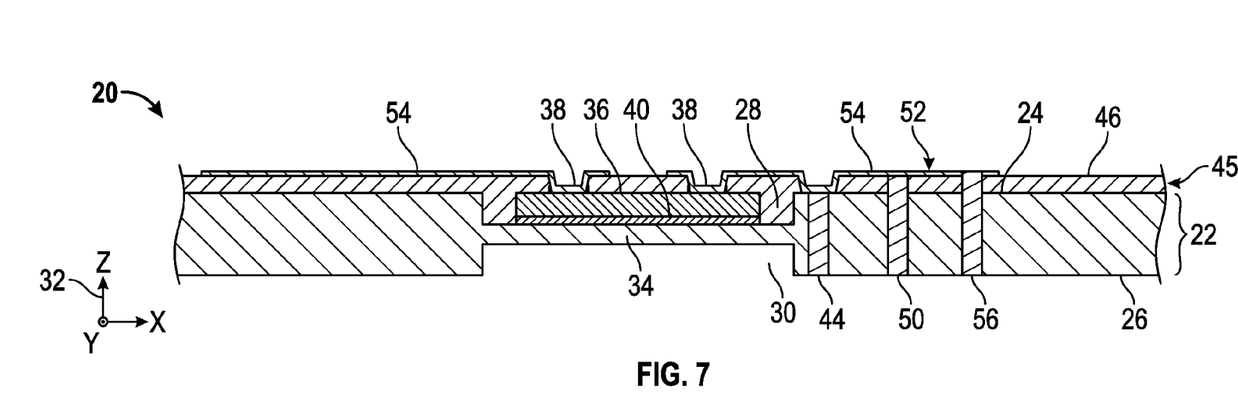

Additional TPVs extending through the body of preformed panel 22 may be produced at various intervals as the RDL layers are successively built-over frontside 24 of panel 22. For example, as shown in FIG. 6, additional TPVs 50 may be formed through frontside $V_1$ dielectric layer 46 utilizing a laser drilling and a paste fill process similar to that described above. In contrast to TPVs 44, TPVs 50 extend not only through preformed panel 22, but also through frontside $V_1$ dielectric layer 46; consequently, TPVs 50 may be referred to more fully herein as a "$V_1$-to-$V_0$ TPVs 50." After the formation of any $V_1$-to-$V_0$ TPVs 50, a first ($M_1$) metal level 52 may then be deposited over the patterned dielectric layer 46 and itself lithographically patterned to yield a plurality of $M_1$ interconnect lines 54 in ohmic contact with bond pads 38 of semiconductor die 36. Once again, additional TPVs 56 may be produced as desired for interconnectivity purposes. However, in this case, each TPV 56 has an upper terminal end intersecting and coplanar with the upper surface frontside $M_1$ metal level 52. Such vias may thus be referred to as "$M_1$-to-$V_0$ TPVs 56." The structure shown in FIG. 7 results.

Figure 8:
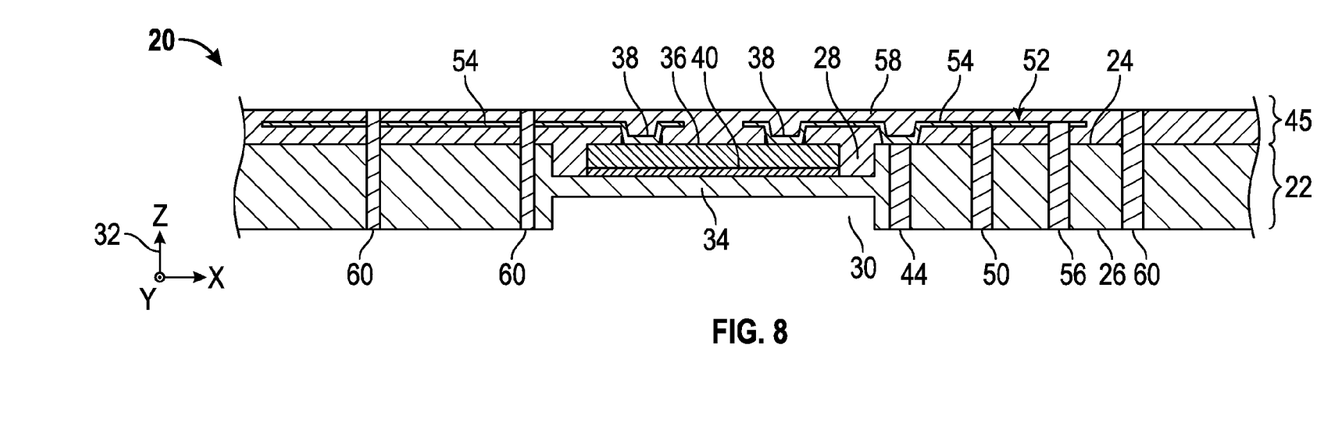
Figure 9:
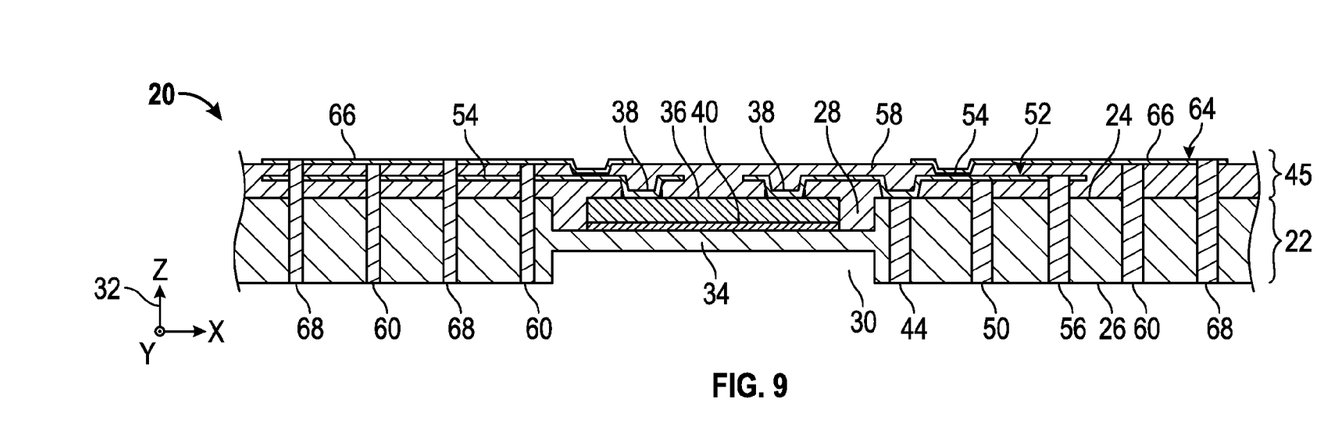

The above-described process steps may be repeated, as appropriate, to produce any number of additional metal levels or layers included within frontside RDL layers 45. For example, as indicated in FIG. 8, an additional layer of dielectric material 58 ("frontside $V_2$ dielectric layer 58") may be spun-on or otherwise deposited over $M_1$ interconnect lines 54 and frontside $V_1$ dielectric layer 46. Afterwards, additional TPVs 60 ("$V_2$-to-$V_0$ TPVs 60") may be formed through frontside $V_2$ dielectric layer 58, through the body of preformed panel 22, through frontside $V_1$ dielectric layer 46, and any intervening $M_1$ interconnect lines 54. Frontside $V_2$ dielectric layer 58 may then undergo lithographical patterning to form openings therein exposing selected portions of the $M_1$ interconnect lines 54. Next, an additional metal layer 64 ("$M_2$ metal level 64") may be deposited and patterned to produce $M_2$ interconnect lines 66 in ohmic contact with the underlying $M_1$ interconnect lines 54 (shown in FIG. 9). If desired, one or more additional $M_2$-to-$V_0$ TPVs 68 may subsequently be produced extending from the upper surface of $M_2$ metal level 64 to backside 26 of preformed panel 22. As indicated in FIG. 9, the upper ends of such $M_2$-to-$V_0$ TPVs 68 extend into $M_2$ metal level 64 and terminate at a level substantially coplanar with the upper surface thereof.

Figure 10:
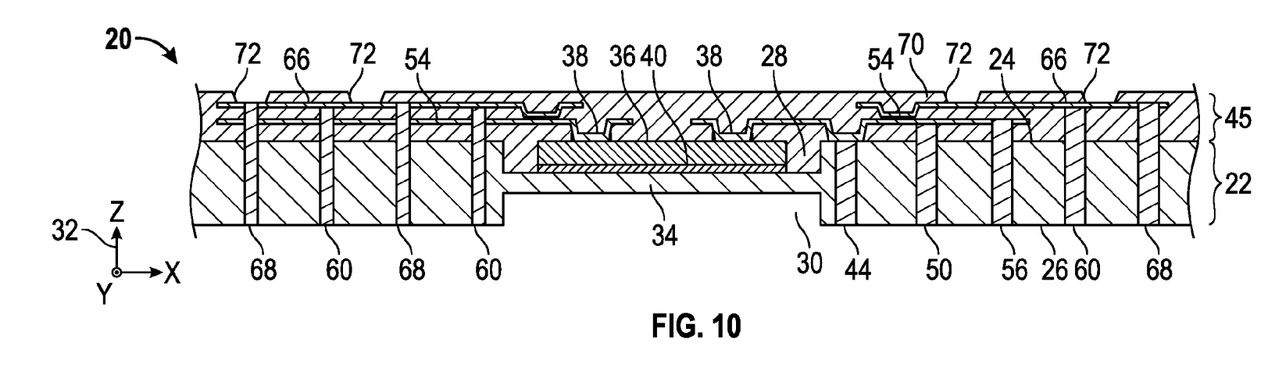

When completed, frontside RDL layers 45 will typically include between one and five metal levels in total; however, the possibility that frontside RDL layers 45 may include more than five metal levels is by no means precluded. After formation of the desired number of metal levels within frontside RDL layers 45, a final dielectric layer 70 (e.g., a capping or passivation layer) may be formed over the uppermost metal level, which is the $M_2$ metal level 64 in the illustrated exemplary embodiment. As shown in FIG. 10, the final RDL dielectric layer 70 may be lithographically patterned to form openings or trenches 72 therein exposing selected regions of $M_2$ interconnect lines 54. Frontside contact arrays may now be formed over the topside of microelectronic package 20 and the other partially-completed packages produced over the other, non-illustrated regions of preformed panel 22. Alternatively, the frontside contact arrays may be produced at a later juncture in the fabrication process; e.g., after build-up of the backside RDL layers, as described below in conjunction with FIGS. 11-13.

Figure 11:
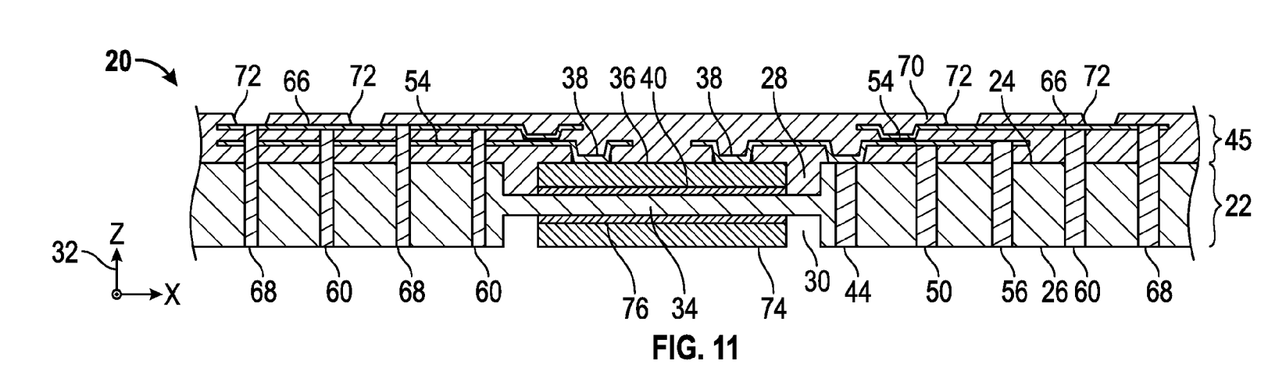
Figure 12:
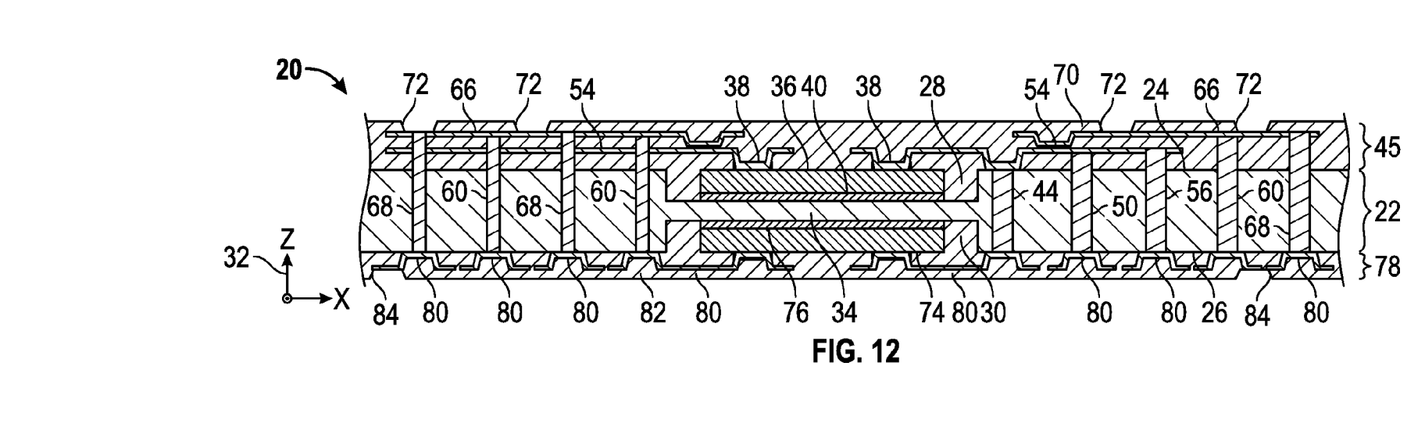
Figure 13:
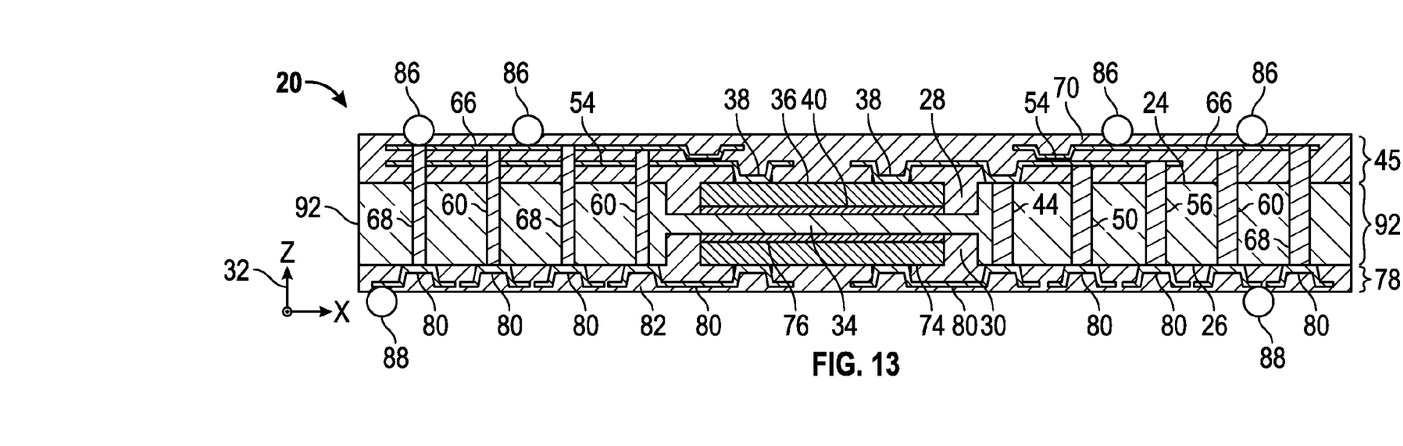

The backside of preformed panel 22 may now be processed in essentially the same manner as was the frontside of panel 22. To begin, partially-fabricated package 20 and, more generally, preformed panel 22 may be inverted and attached to a non-illustrated support structure, such a ceramic carrier similar to carrier 35 shown in FIG. 1. With reference to FIG. 11 (wherein the preformed panel 22 is shown in a non-inverted orientation for consistency with the previously-discussed figures), a second group of semiconductor die 74 (or other microelectronic devices) may be positioned within backside cavities 30 (again, only one of which is included in the illustrated portion of panel 22). In contrast to semiconductor die 36 installed within frontside cavities 28, semiconductor die 74 are positioned face-down; that is, each die 74 is positioned with its active side or contact-bearing side exposed through backside 30 of preformed panel 22. The active sides of semiconductor die 74 thus face away from semiconductor die 36; and, conversely, the active sides of die 36 face away from die 74. As was the case previously, the non-active or backside of each semiconductor die 74 may be bonded to the partition wall 34 bounding backside cavity 30 in which semiconductor die 74 is positioned. For example, as shown in FIG. 11, die 74 may be bonded to the lower surface of partition wall 34 utilizing a layer of epoxy 76 or other adhesive. Again, a circumferential clearance may be provided around each semiconductor die 74; and the active side of each die 74 may be positioned at substantially coplanar with backside surface 26 of panel 22 when the die 74 is properly seated within its backside cavity 30.

After positioning semiconductor die 74 (or other microelectronic devices) within backside cavities 30, one or more backside RDL layers 78 may be formed over backside 26 of preformed panel 22 and the active-sides of die 74. As are frontside RDL layers 45 described above, backside RDL layers 78 are produced to include a dielectric body 82, which may be formed as one or more successively-deposited (e.g., spun-on) dielectric layers. Electrically-conductive paths or interconnect lines 80 are further formed within dielectric body 82 and in ohmic contact with the bond pads of semiconductor die 74 utilizing, for example, lithographical patterning and conductive-material deposition processes of the type described above. After formation of the backside RDL layers 78, trenches and openings 84 may be created within the final or outermost dielectric RDL dielectric layer to expose selected regions of backside interconnect lines 80. The structure shown in FIG. 12 results.

Figure 14:
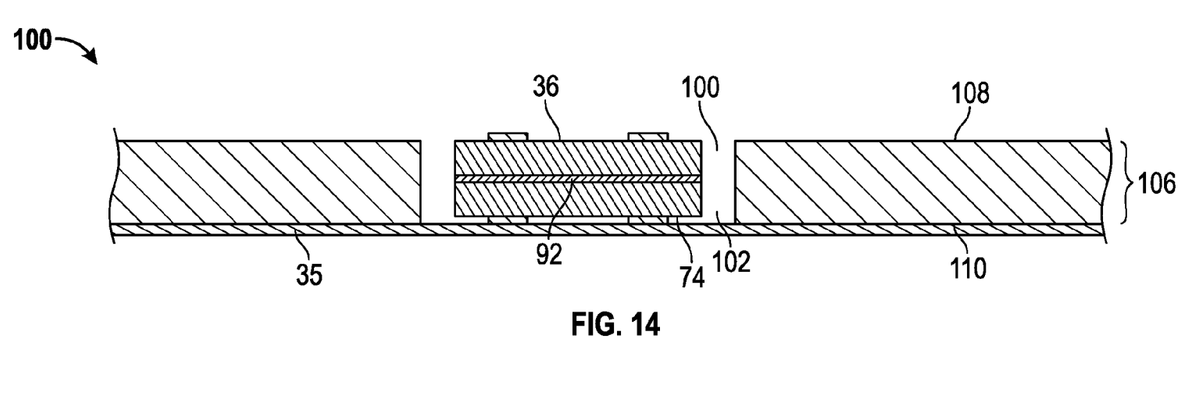
FIGS. 14 and 15 illustrate a microelectronic package containing two microelectronic devices positioned in a back-to-back relationship and disposed within non-partitioned cavities provided in a preformed panel (partially shown), as illustrated at various stages of manufacture and produced in accordance with a second exemplary embodiment of the microelectronic package fabrication method.

A frontside contact array and/or a backside contact array may now be formed over partially-completed microelectronic package 20, as well as over the other partially-completed packages fabricated over the non-illustrated regions of preformed panel 22. With respect to partially-completed package 20, specifically, and referring now to FIG. 13, a frontside contact array 86 and backside contact array 88 may be formed over frontside RDL layers 45 and backside RDL layers 78, respectively. As indicated in FIG. 14, frontside contact array 86 may be produced as a first BGA including a plurality of solder balls deposited into openings 72 (FIGS. 10-12) formed in the outermost RDL dielectric layer 70 and in ohmic contact with frontside interconnect lines 66. Similarly, backside contact array 86 may be produced as a second BGA including a plurality of solder balls deposited into openings 84 (FIG. 10) formed in the outermost backside RDL dielectric layer and in ohmic contact with backside interconnect lines 80. While two contact arrays 86 and 88 are included in microelectronic package 20 in the illustrated example, this is not necessary in all embodiments as any combination of TPVs 44, 50, 56, 60, and 68 can be utilized to route electrical signals through the body of package 20. For example, TPVs 44, 50, 56, 60, and 68 can be employed to electrically interconnect die 36 to a backside contact array and/or die 74 to a frontside contact array in further implementations of package 20.

While frontside and backside contact arrays 86 and 88 assume the form of BGAs in the exemplary embodiment shown in FIGS. 1-13, it is emphasized that contact arrays 86 and 88 may assume other forms suitable for providing externally-accessible points-of-contact to the interconnect lines embedded within the frontside RDL layers 45 and backside RDL layers 78. For example, in further embodiments, the frontside and/or backside contact array may comprise externally-exposed bond pads in ohmic contact with the interconnect lines formed in the frontside and/or backside RDL layers; externally-exposed portions of the frontside and/or backside RDL interconnect lines; or electronically-conductive bodies formed in contact with the frontside and/or backside interconnect lines other than solder balls, such as plated pillars or bodies of electrically-conductive paste.

The fabrication of microelectronic package 20 concludes with the singulation or separation of preformed panel 22.

Preformed panel 22 may be singulated using, for example, a dicing saw to produce a plurality of microelectronic packages in which package 20 is included. The completed microelectronic package 20 is shown in FIG. 11 wherein the vertical package sidewalls 90 have been defined by singulation of panel 22. The singulated piece of panel 22 included within the completed microelectronic package 20 is referred to herein below as the "package body" and is identified in FIG. 11 by reference numeral "92." In alternative embodiments, dicing techniques other than mechanical sawing can be utilized to separate preformed panel 22 into discrete microelectronic packages, such as laser cutting.

As can be seen in FIG. 11, completed microelectronic package 20 includes opposing (opposite facing) semiconductor die 36 and 74 disposed within a prefabricated package body 92; that is, a package body produced prior to insertion of die 36 and 74 by, for example, singulation of a preformed panel of the type described above. Semiconductor die 36 and 74 are mounted within frontside and backside cavities 28 and 30, respectively, in a back-to-back relationship. The active or bond pad-bearing side of semiconductor die 36 faces the package topside and is in ohmic contact with interconnect lines formed in frontside RDL layers 45. Conversely, the active or bond pad-bearing side of die 74 faces the package backside and is in ohmic contact with interconnect lines formed in backside RDL layers 78. In one embodiment, die 36 is electrically coupled to frontside contact array 88 through frontside RDL layers 45, while die 74 is electrically coupled to backside contact array 86 through backside RDL layers 78. Finally, in the illustrated example shown in FIG. 11, completed package 20 includes TPVs (i.e., TPVs 56 and 68) that intersect, extend into, and terminate coplanar with the metal layers included within frontside RDL layers 45 and/or backside RDL layers 78.

In the foregoing example, each frontside cavity 28 was separated from its aligning backside cavity 30 by an intervening partition wall 34. In further embodiments, preformed panel 22 may not include such a partition wall between aligning frontside and backside cavities 28 and 30. In this case, each frontside cavity 28 may connect to or adjoin its aligning backside cavity 30 to form a continuous tunnel extending through the body of preformed panel 22. Further emphasizing this point, FIG. 14 illustrates a partially-fabricated microelectronic package 100 including connected frontside and backside cavities 102 and 104 formed in a preformed panel 106 (partially-shown). As can be seen, cavities 102 and 104 join to form a complete tunnel or via extending through the body of panel 106 from panel frontside 108 to the backside 110 thereof. For this reason, frontside and backside cavities 102 and 104 may be collectively referred to herein as "connected cavities 102, 104." Additional connected cavities 102, 104 may likewise be provided through the other, non-illustrated regions of panel 106 over which other microelectronic packages are produced.

During fabrication of microelectronic package 100 and the other packages produced in parallel therewith, and utilizing like reference numerals to denote like structural elements, two semiconductor die 36 and 74 (or other microelectronic devices) are positioned within each connected cavity 102, 104 in an opposing relationship such that their active or bond pad-bearing sides face in opposing directions. As a specific example, and referring to FIG. 14, semiconductor die 36 and 74 may be positioned in a back-to-back or vertically stacked relationship (also referred to as a "back-to-back device stack" herein). The non-active backsides of die 36 and 74 may be bonded to each other utilizing a layer of epoxy 112 or other bonding material, either prior to or after positioning within connected cavities 102, 104. The active side of lower die 74 may contact and rest upon temporary substrate 35, which may include a layer of adhesive tape to help retain the die stack in its proper position. As was the case previously, a circumferential clearance may be provided around die 36, die 74, and the surrounding sidewalls of cavities 102 and 104.

Figure 15:
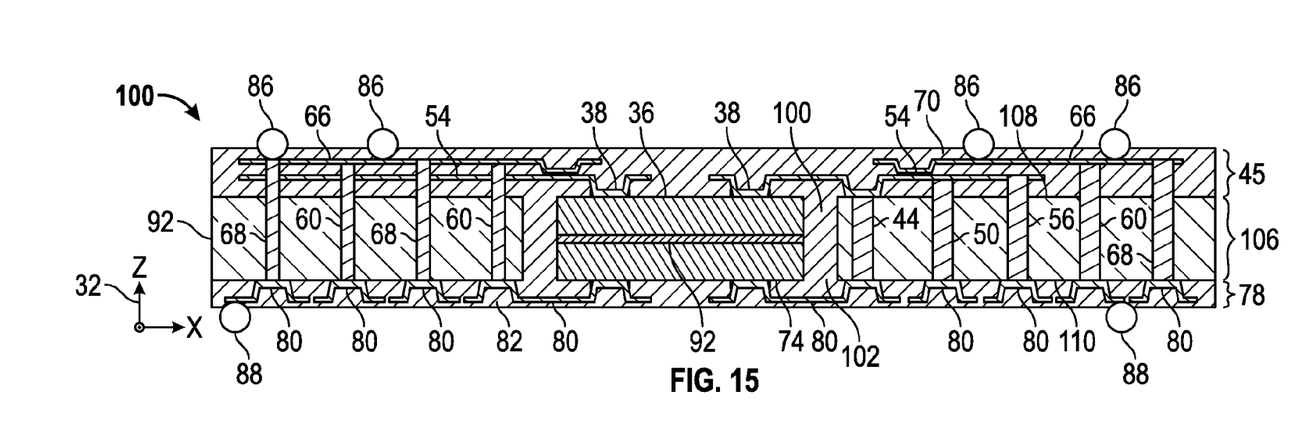

After positioning each die stack 36, 74 within a connected cavity 102, 104, microelectronic package 100 and, more generally, preformed panel 106 may be processed in the manner described above to complete fabrication of package 100. An example of one manner in which microelectronic package 100 may appear when completed is shown in FIG. 15 (again, wherein like reference numerals are utilized to denote structural elements similar to those included within completed microelectronic package 20 shown in FIG. 13). Briefly stated, and by way of example only, frontside RDL layers 86 may be built over frontside 108 of preformed panel 106; backside RDL layers 78 may be built over backside 110 of panel 106, and frontside and/or backside contact arrays 86 and 88 may be produced utilizing, for example, a bumping process. As described above, TPVs 44, 50, 56, 60, and/or 68 may be formed prior to or during fabrication of the frontside and/or backside RDL layers 45 and 78. Afterwards, preformed panel 106 may be singulated to yield a plurality of completed microelectronic packages in including microelectronic package 100 shown in FIG. 15.

There has thus been described multiple exemplary embodiments of a fabrication process suitable for producing double-sided FO-WLP packages each containing at least two opposed devices in a package body formed by singulation of a pre-molded or otherwise preformed panel. Advantageously, the above-described fabrication process enables the production of highly dense packages containing multiple devices within a relatively compact package, which can decrease material requirements and therefore reduce cost. However, due to the density of such packages, significant heat concentrations may occur during operation if adequate heat dissipation is not provided. However, due to the inclusion of both front and backside RDL layers, it may be difficult to integrate conventional heat dissipation structures (e.g., relatively large metallized areas or attached copper slugs) into the microelectronic package. Therefore, to improve heat dissipation from the package, embodiments of the microelectronic package may be fabricated to include bodies or columns of thermally-conductive material extending through the package body (referred to herein as "heat dissipation vias") and, preferably, through the uppermost and lowermost metal level included within the frontside and backside RDL layers, respectively. An example of a microelectronic package including such heat dissipation vias will now be described in conjunction with FIGS. 16 and 17.

Figure 16:
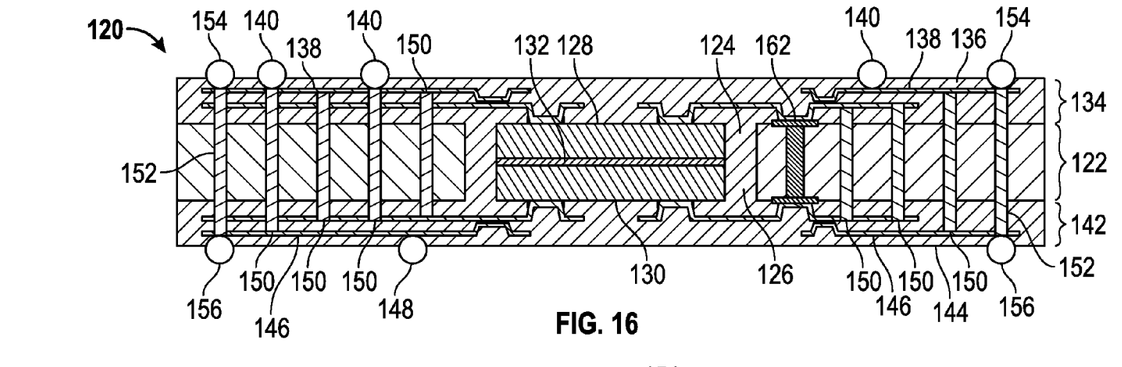
FIG. 16 is a cross-sectional view of a microelectronic package including two microelectronic devices positioned in a back-to-back relationship within a preformed package having at least one substrate routing structure embedded therein and a number of heat dissipation vias formed therethrough, as illustrated in accordance with a further exemplary embodiment of the microelectronic package fabrication method.
Figure 17:
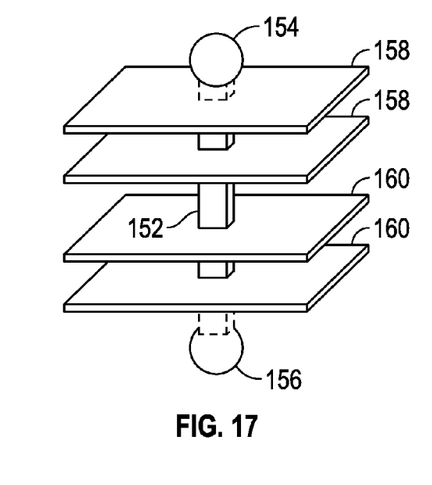
FIG. 17 is an isometric cutaway view illustrating one of the exemplary heat dissipation vias shown in FIG. 16, as well as portions of the frontside and backside metal levels intersected thereby.

FIG. 16 illustrates, in cross-section, a completed microelectronic package 120, as illustrated in accordance with a further exemplary embodiment of the present invention. As did microelectronic package 100 described above in conjunction with FIG. 15, microelectronic package 120 includes a package body 122 having connected frontside and backside cavities 124 and 126. Opposing microelectronic devices 128 and 130 (e.g., semiconductor die) are positioned within cavities 124 and 126 in a back-to-back or vertically stacked relationship. As was the case previously, the backsides of devices 128 and 130 may be bonded together utilizing a layer of adhesive 132. One or more frontside RDL layers 134 are formed over the frontside of package body 122 and include a dielectric body 136 in which a number of interconnect lines 138 is formed to provide, for example, electrical communication between device 128 and a frontside contact array 140.

Conversely, one or more backside RDL layers 142 are formed over the backside of package body 122 and include a dielectric body 144 in which a plurality of interconnect lines 146 is formed to provide, for example, electrical communication between device 130 and a backside contact array 148. Finally, as was microelectronic package 100 (FIG. 16), microelectronic package 120 may be produced to include any number of TPVs 150 to provide electrical communication between frontside RDL layers 134 and backside RDL layers 142.

Microelectronic package 120 differs from microelectronic package 100 (FIG. 15) in two primary aspects. First, as shown in FIG. 16, microelectronic package 120 is fabricated to include a number of heat dissipation vias 152. Heat dissipation vias 152 each extend from a metal level included within frontside RDL layers 134, through the body of preformed panel 122, and to a metal level included within backside RDL layers 142. It is generally preferred that heat dissipation vias 152 extend to at least the final or outermost metal level included within both the frontside and backside RDL layers 134 and 142. Furthermore, as indicated in FIG. 16 and also in FIG. 17 (an isometric view of one heat dissipation via 152 illustrating portions of the frontside metal levels 158 and the backside metal levels 160 intersected thereby), heat dissipation vias 152 may extend through the final RDL dielectric layer included in both frontside and backside RDL layers 134 and 142. In this case, the opposing terminal ends of each dissipation via 152 may be exposed through the topside and backside of microelectronic package 120; or, instead, solder balls 154 and 156 (or another thermally-conductive structure) may be placed in thermal contact with the opposing ends of vias 152 to increase the surface area available for convective or conductive heat transfer and/or to facilitate to a heat sink when package 120 is mounted within a larger system. Heat dissipation vias 152 may be formed utilizing, for example, a laser drilling and paste fill process of the type described above. Vias 152 may or may not be electrically-conductive. In embodiments wherein vias 152 are electrically-conductive, heat dissipation vias 152 may be utilized for signal routing or, instead, may be electrically-inactive (that is, not utilized for conduction of electrical current). The inclusion of heat dissipation vias 152 may thus improve heat rejection during operation of microelectronic package 120 to improve the thermal performance thereof.

In further contrast to microelectronic package 100 (FIG. 15), microelectronic package 120 is produced to include substrate routing and, specifically, through package routing structures 162 (one of which is shown in FIG. 16). Prefabricated routing structures 162 are embedded within package body 122 during initial fabrication. In this case, package body 122 may be produced by singulation of a preformed panel, which is a plastic substrate, a ceramic alumina substrate, or another substrate composed of a non-resin based material. During production of RDL layers 134 and/or RDL layers 142, one or more interconnect lines contained within the RDL layers are formed in ohmic contact with prefabricated routing structure 162 to provide an electrical signal path through package body 122. Other discrete structures, components, and/or devices may be molded into the body of the preformed panel or otherwise embedded within the preformed panel in further embodiments in addition to or in lieu of prefabricated routing structures 162. Prefabricated routing structures 162 and heat dissipation vias 152 can also advantageously be included within package 100 (FIGS. 14 and 15) and package 20 (FIGS. 1-13) in further implementation; and, consequently, such features do not render these embodiments mutually exclusive in the context of the present disclosure.

The foregoing has thus provided embodiments of a fabrication process suitable for producing microelectronic packages each containing at least two microelectronic devices positioned within an opposite (opposite facing) relationship, such as two semiconductor die positioned in a back-to-back relationship In at least some embodiments, the microelectronic packages are two sided (include frontside and backside contact arrays) and, consequently, are well-suited for integration into three dimensional packaging (e.g., package-on-package) systems. In one embodiment, the above-described fabrication method is carried-out utilizing a preformed panel having at least one frontside cavity (that is, a cavity formed in the frontside surface of the preformed panel) and at least one backside cavity (that is, a cavity formed in the opposing, backside surface of the panel). First and second microelectronic devices are positioned in the frontside and backside cavities of the preformed panel, respectively. One or more frontside RDL layers are produced over the frontside of the preformed panel in ohmic contact with or otherwise electrically coupled to the first microelectronic device. Similarly, one or more backside RDL layers are formed over the backside of the preformed panel in ohmic contact with or otherwise electrically coupled to the second microelectronic device. A frontside contact array is produced over the frontside of the preformed panel and electrically coupled to at least the first microelectronic device through the frontside RDL layers. Lastly, the preformed panel is singulated to yield a microelectronic package including a package body in which the first and second microelectronic devices are embedded.

In another embodiment, the fabrication method includes positioning first and second microelectronic devices in a back-to-back relationship within at least one cavity provided in a preformed package body having a frontside and a backside. One or more frontside RDL layers are produced over the frontside of the preformed package body in ohmic contact with the first microelectronic device, and one or more backside RDL layers are produced over the backside of the preformed substrate and in ohmic contact with the second microelectronic device. A frontside contact array is formed over the frontside RDL layers and electrically coupled to at least the first microelectronic device through the frontside RDL layers. Similarly, a backside contact array is produced over the backside RDL layers and electrically coupled to at least the second microelectronic device through the backside RDL layers.

In a further embodiment, a microelectronic package is provided that includes a preformed package body having a frontside cavity and a backside cavity. A first microelectronic device is disposed within the frontside cavity, and a second microelectronic device disposed within the backside cavity. One or more frontside redistribution layers are located over the preformed package body in ohmic contact with the first microelectronic device. One or more backside redistribution layers are likewise located over the preformed package body in ohmic contact with the first microelectronic device. A frontside contact array is disposed over the frontside of the preformed package body and electrically coupled to at least the first microelectronic device through the frontside redistribution layers. In certain embodiments, a clearance may be provided between the first microelectronic device and the sidewalls of the preformed package body defining the frontside cavity. The frontside redistribution layers may comprise a dielectric material filling the clearance and surrounding the first microelectronic device.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating a microelectronic package using a preformed panel having at least one frontside cavity and at least one backside cavity, the method comprising:
    positioning first and second microelectronic devices in the frontside and backside cavities of the preformed panel, respectively, a circumferential clearance provided around the first microelectronic device when positioned within the frontside cavity;
    producing one or more frontside redistribution layers over the frontside of the preformed panel electrically coupled to the first microelectronic device, the circumferential clearance at least partially filled with a photoimagable dielectric material during the production of the frontside redistribution layers;
    producing one or more backside redistribution layers over the backside of the preformed panel electrically coupled to the second microelectronic device;
    forming a frontside contact array over the frontside of the preformed panel and electrically coupled to at least the first microelectronic device through the frontside redistribution layers; and
    singulating the preformed panel to yield a microelectronic package including a package body in which the first and second microelectronic devices are embedded.

2. The method of claim 1 wherein the first and second microelectronic devices comprise first and second semiconductor die each having an active surface over which a plurality of bond pads is formed, and wherein positioning comprises placing the first and second semiconductor die such that their respective active surfaces face in opposing directions.

3. The method of claim 1 wherein positioning comprises placing the first and second microelectronic devices in a back-to-back relationship.

4. The method of claim 1 wherein positioning comprises placing the first and second microelectronic devices in substantial alignment, as taken along an axis orthogonal to the frontside of the preformed panel.

5. The method of claim 1 further comprising forming a backside contact array over the backside of the preformed panel and electrically coupled to at least the second microelectronic device through the backside redistribution layers.

6. The method of claim 1 wherein the preformed panel is produced utilizing a molding process.

7. The method of claim 1 wherein the first microelectronic device comprises a semiconductor die having an active side over which a plurality of bond pads is formed, and wherein the frontside redistribution layers are produced over the active side of the semiconductor die and in ohmic contact with the bond pads.

8. The method of claim 7 wherein the active side of the semiconductor die is substantially coplanar with the frontside of the preformed panel when the semiconductor is positioned within the frontside cavity.

9. The method of claim 1 wherein the preformed panel is formed to include at least one prefabricated through package via, and wherein the frontside redistribution layers are produced in ohmic contact with the prefabricated through package via.

10. The method of claim 9 wherein the prefabricated through package via is molded into the preformed panel.

11. The method of claim 1 wherein the frontside redistribution layers are fabricated to include a first metal level, and wherein the method further comprises forming at least one through package via extending through the prefabricated package body and through the first metal level.

12. The method of claim 10 wherein forming at least one through package via comprises:
    laser drilling an opening extending through first metal level and through the through package via; and
    filling the opening with an electrically-conductive paste.

13. The method of claim 1 wherein the frontside and backside redistribution layers each comprise at least one metal level, and wherein the method further comprises forming at least one through package via extending from the outermost metal level of the frontside redistribution layers to the outermost metal level of the backside redistribution layers.

14. The method of claim 1 wherein the preformed panel is fabricated to include a partition wall separating the frontside cavity and the backside cavity, and wherein positioning the first and second microelectronic devices comprises:
    bonding the first microelectronic device to a first surface of the partition wall; and
    bonding the second microelectronic device to a second, opposing surface of the partition wall.

15. The method for fabricating a microelectronic package using a preformed panel having at least one frontside cavity and at least one backside cavity, the method comprising:
    positioning first and second microelectronic devices in the frontside and backside cavities of the preformed panel, respectively;
    producing one or more frontside redistribution layers over the frontside of the preformed panel electrically coupled to the first microelectronic device and comprising at least one metal level;
    producing one or more backside redistribution layers over the backside of the preformed panel electrically coupled to the second microelectronic device and comprising at least one metal level;
    forming at least one electrically inactive through package via extending from the outermost metal level of the frontside redistribution layers to the outermost metal level of the backside redistribution layers;
    forming a frontside contact array over the frontside of the preformed panel and electrically coupled to at least the first microelectronic device through the frontside redistribution layers; and
    singulating the preformed panel to yield a microelectronic package including a package body in which the first and second microelectronic devices are embedded.

16. A method for fabricating a microelectronic package using a preformed panel having at least one frontside cavity and at least one backside cavity, the frontside cavity connecting with the backside cavity to form an opening extending through the preformed panel, the method comprising:
    positioning first and second microelectronic devices in the frontside and backside cavities of the preformed panel, respectively, positioning the first and second microelectronic devices comprising:
        bonding the first microelectronic device to the second microelectronic device to produce a back-to-back device stack; and positioning the back-to-back device stack in the opening;

producing one or more frontside redistribution layers over the frontside of the preformed panel electrically coupled to the first microelectronic device;

producing one or more backside redistribution layers over the backside of the preformed panel electrically coupled to the second microelectronic device;

forming a frontside contact array over the frontside of the preformed panel and electrically coupled to at least the first microelectronic device through the frontside redistribution layers; and singulating the preformed panel to yield a microelectronic package including a package body in which the first and second microelectronic devices are embedded.

17. A microelectronic package, comprising:

a preformed package body having a frontside cavity and a backside cavity;

a first microelectronic device disposed within the frontside cavity;

a clearance provided between the first microelectronic device and sidewalls of the preformed package body defining the frontside cavity;

a second microelectronic device disposed within the backside cavity;

one or more frontside redistribution layers over the preformed package body in ohmic contact with the first microelectronic device, the frontside redistribution layers comprising a dielectric material filling the clearance and surrounding the first microelectronic device;

one or more backside redistribution layers over the preformed package body in ohmic contact with the first microelectronic device; and a frontside contact array disposed over the frontside of the preformed package body and electrically coupled to at least the first microelectronic device through the frontside redistribution layers.

18. The microelectronic package of claim 17 wherein the first and second microelectronic devices are positioned in a back-to-back relationship.

19. The microelectronic package of claim 18 wherein a backside of the first microelectronic device is bonded to a backside of the second microelectronic device.

20. The microelectronic package of claim 18 wherein the preformed package body includes a partition wall separating the frontside cavity and the backside cavity, and wherein the first and second microelectronic devices are bonded to opposing surfaces of the partition wall.

* * * * *